United States Patent
Kim et al.

(10) Patent No.: US 7,615,470 B2
(45) Date of Patent: Nov. 10, 2009

(54) METHOD OF MANUFACTURING GALLIUM NITRIDE SEMICONDUCTOR

(75) Inventors: Yong Jin Kim, Gumi-Si (KR); Dong Kun Lee, Gumi-Si (KR)

(73) Assignee: Siltron Inc., Gumi-si (KR)

( * ) Notice: Subject to any disclaimer, the term of this patent is extended or adjusted under 35 U.S.C. 154(b) by 447 days.

(21) Appl. No.: 11/302,957

(22) Filed: Dec. 13, 2005

(65) Prior Publication Data
US 2006/0145187 A1 Jul. 6, 2006

(30) Foreign Application Priority Data
Dec. 14, 2004 (KR) ............. 10-2004-0105371

(51) Int. Cl.
*H01L 21/322* (2006.01)
(52) U.S. Cl. .............. 438/471; 438/472; 438/478; 438/483; 438/493
(58) Field of Classification Search ............. None
See application file for complete search history.

(56) References Cited

U.S. PATENT DOCUMENTS

| 4,312,012 | A | * | 1/1982 | Frieser et al. ............. 257/713 |
| 4,679,359 | A | * | 7/1987 | Suzuki ..................... 451/40 |
| 4,738,056 | A | * | 4/1988 | Suzuki ..................... 451/78 |
| 6,391,748 | B1 | * | 5/2002 | Temkin et al. ............. 438/478 |
| 6,579,359 | B1 | * | 6/2003 | Mynbaeva et al. ......... 117/94 |
| 6,582,280 | B1 | * | 6/2003 | Otaka et al. .............. 451/39 |
| 6,929,867 | B2 | * | 8/2005 | Armitage et al. .......... 428/622 |
| 7,014,710 | B2 | * | 3/2006 | Fang et al. ............... 117/92 |
| 7,198,671 | B2 | * | 4/2007 | Ueda ...................... 117/84 |

* cited by examiner

*Primary Examiner*—Zandra Smith
*Assistant Examiner*—Khanh B Duong
(74) *Attorney, Agent, or Firm*—Christie, Parker & Hale, LLP

(57) ABSTRACT

The present invention provides to a gallium nitride (GaN) semiconductor and a method of manufacturing the same, capable of reducing crystal defects caused by a difference in lattice parameters, and minimizing internal residual stress. In particular, since a high-quality GaN thin film is formed on a silicon wafer, manufacturing costs can be reduced by securing high-quality wafers with a large diameter at a low price, and applicability to a variety of devices and circuit can also be improved.

10 Claims, 4 Drawing Sheets

METHOD OF MANUFACTURING GALLIUM NITRIDE SEMICONDUCTOR

CROSS-REFERENCE TO RELATED APPLICATION

This application claims priority of Korean Patent Application No. 10-2004-0105371 filed Dec. 14, 2004, the entire disclosure of which is incorporated by reference herein.

FIELD OF THE INVENTION

The present invention relates to a gallium nitride (GaN) semiconductor having an improved GaN thin film and a method of manufacturing the same.

BACKGROUND OF THE INVENTION

GaN has a direct bandgap of 3.4 eV at room temperature and, if combined with indium nitride (InN) or aluminum nitride (AlN), can have a direct bandgap of 1.9 eV (InN) or 6.2 eV (AlN). Due to its wide wavelength range spanning the visible light to ultraviolet regions of the electromagnetic spectrum, GaN is a desirable material for light-emitting element applications. Since the material's emission wavelength can be controlled over a wide range, GaN can be used to make light-emitting elements capable of emitting over a wide spectrum of visible light. Consequently, the market for GaN is huge, and includes full color electric signs using red, green and blue light-emitting elements, and other illuminators using a white light-emitting element. As a result, extensive research on the GaN semiconductor has been conducted. In particular, GaN has attracted significant attention as a light-emitting element of a blue light-emitting diode (LED), a blue laser diode (LD), and similar devices in the short wavelength region.

However, there hardly exists a substrate that is lattice matched with this GaN semiconductor, and differences in lattice parameters and thermal expansion coefficients therebetween are too large. Therefore, it is very difficult to grow a high-quality nitride semiconductor thin film.

In general, a sapphire ($Al_2O_3$) or silicon carbide (SiC) substrate is used for growing a GaN semiconductor thin film. The theoretical lattice parameter of sapphire in the a-axis is 4.758 Å, while the lattice parameter of GaN is 3.186 Å. That is, their theoretical lattice parameters are different from each other by more than 30%. Consequently, a tensile strain is caused when GaN grows on a sapphire substrate. However, when GaN grows on actual (0001) sapphire, an effective lattice parameter of sapphire is smaller than that of GaN by about 14%, which causes a compressive strain. Further, since their thermal expansion coefficients are different from each other by about 25%, the stress is generated at the interface between the sapphire and GaN. Moreover, since lattice defects having large threading dislocation density of about $10^{14}/cm^2$ are caused, it is difficult to achieve the growth of a high-quality single crystal. In addition, since a crack can be caused when the thickness exceeds 10 μm, it is difficult to grow a high-quality GaN thin film layer, and the life and characteristic efficiency of devices made therefrom can also be reduced.

However, by successful growing a GaN thin film having excellent electric and optical characteristics and crystallinity on a sapphire substrate after forming an AlN buffer layer on the sapphire substrate, the above problems have been lessened to some extent. Then, various materials such as GaN or AlGaN, in addition to AlN, can be used for forming the buffer layer, and large differences in lattice parameters and thermal expansion coefficients can also be relieved by means of the heteroepitaxy in which a GaN thin film grows using the buffer layer.

Nevertheless, when the buffer layer for the heteroepitaxy is grown to about 1 to 500 nm, and the GaN thin film grows on the grown buffer layer, the buffer layer includes crystal defects due to differences in thermal expansion coefficients and lattice parameters of the substrate and buffer layer. The crystal defects are directly transferred to the GaN thin film. As a result, the large number of crystal defects make it difficult to form a high-quality GaN thin film.

In addition, although a sapphire substrate can be manufactured to have a 4-inch diameter, 2-inch substrates are widely used. This manufacturing preference has a negative impact on the productivity of manufacturing LEDs or LDs in large quantities. A need exists for high-quality substrate that can be manufactured with a large diameter, as a viable replacement for sapphire substrates.

Moreover, sapphire is an insulating material because it is an oxidized material. Therefore, for a device manufactured using 2 sapphire substrate, the back ohmic contact cannot be easily formed, as compared with other devices manufactured using conductive substrates. Accordingly, an additional process or post-process is required for forming electrodes while manufacturing the device, which increases the complexity of the overall manufacturing process. As a result, manufacturing costs are increased, and the performance of devices can be degraded due to the increased serial resistance of the device.

More recently, a high-quality, 2-inch substrate made of SiC has become commercially available. The lattice parameter of SiC is different from that of GaN by 3.3%, which is smaller than the difference of 13.8% between the sapphire and GaN. Thus, SiC is preferable to sapphire in view of lattice matching. In addition, since SiC has excellent chemical stability and high-temperature characteristics, it attracts considerable attention. However, SiC is more expensive than sapphire, and the performance of the GaN device using a SiC substrate is reported to be inferior to that using a sapphire substrate.

Although substantial research has been conducted on the growth of the GaN thin film using a silicon substrate as an alternative to sapphire or SiC substrates there remain problems due to the differences in the lattice parameters and thermal expansion coefficients occurring in the conventional sapphire and SiC substrates. The silicon substrate has an advantage in that the manufacturing costs can be reduced by securing high-quality substrates with a large diameter at a low price, and the applicability to a variety of devices and circuits can also be improved through the integration in addition to the manufacture of a single optical device. However, the silicon substrate still has problems to be solved if more stable devices having reproducible characteristics are to be produced. The difference in the lattice parameter between the GaN thin film and silicon is about 18%, and the defect density of $10^{10}/cm^2$ is reported to exist in the GaN thin film formed on the silicon substrate. Above all, it is important to allow the high-quality GaN thin film to grow by decreasing the lattice defects due to the difference in the lattice parameter.

SUMMARY OF THE INVENTION

The present invention is conceived to solve the aforementioned problems in the prior art, including the need to provide a GaN semiconductor and a method of manufacturing the same, which can reduce crystal defects caused by differences in lattice parameter and thermal expansion coefficient between a GaN semiconductor thin film and a substrate, thereby improving performance and reliability of the semiconductor.

The invention also addresses the need for a method of manufacturing a high-quality GaN semiconductor using a silicon substrate, which can be grown on a large scale and manufactured by an existing manufacturing process, in addition to a conventional sapphire or SiC substrate.

According to one aspect of the invention, there is provided a gallium nitride (GaN) semiconductor, which comprises a wafer (preferably a silicon wafer) having a desired defect layer formed in a predetermined region in the wafer; and a GaN thin film formed on the wafer. Preferably, the desired defect layer is formed by blasting the wafer with a high pressure slurry containing $SiO_2$ particles. More preferably, the predetermined region is within a range of 1 to 4 μm from a top surface of the wafer. In one embodiment, the wafer contains silicon.

In another embodiment, the GaN semiconductor further comprises a buffer layer formed between the wafer and the GaN thin film. Preferably, the buffer layer is comprises at least one material selected from the group consisting of AlN, GaN, ZnO, and MgO.

According to another aspect of the invention, there is provided a method of manufacturing a gallium nitride (GaN) semiconductor, comprising the steps of preparing a wafer (preferably silicon) having a desired defect layer formed in a desired region in the wafer, and growing a GaN thin film on the wafer. Preferably, the step of preparing the wafer having a wafer having a desired defect layer formed in a desired region in the wafer comprises the steps of blasting a slurry containing desired particles to the wafer at high pressure, applying heat treatment to the wafer, and polishing and cleaning the wafer. In one embodiment, the desired particles comprise $SiO_2$, and the slurry has a specific gravity of 1.020 to 1.030 $g/cm^3$. Preferably, the step of blasting a slurry containing desired particles to the wafer at high pressure comprises the step of blasting the slurry such that a defect layer is formed within a range of 1 to 4 μm from a top surface of the wafer. Further, in one embodiment, the polishing step comprises the step of polishing the top of the wafer at a depth of less than 1 μm.

Preferably, the GaN thin film is grown at a rate of 1 μm per hour at a temperature of 1000 to 1200° C.

In another embodiment of the invention the method of the present invention further comprises the step of growing a buffer layer on the wafer after the wafer is prepared and prior to the step of growing the GaN thin film. Preferably, the buffer layer is grown to a thickness of 10 to 1000 nm at a temperature of 500 to 1100° C.

BRIEF DESCRIPTION OF THE DRAWINGS

Various features and advantages of the present invention will become apparent from the following description of preferred embodiments given in conjunction with the accompanying drawings, in which.

DETAILED DESCRIPTION OF THE INVENTION

Hereinafter, a GaN semiconductor and a method of manufacturing the same according to a preferred embodiment of the present invention will be described in detail with reference to the accompanying drawings.

In the present invention, a (111) plane of silicon is used as a growth substrate of a GaN semiconductor. The theoretical lattice parameter of the a-axis of silicon is 5.42 Å. When a (100) plane of silicon is used as a growth substrate, the silicon has an advantage in that its chemical characteristics are stable and its electric characteristics are long-lasting, but (100) silicon has a significantly great lattice mismatch, as compared with GaN which has a lattice parameter of 3.186 Å. However, if a (111) plane is used, the theoretical lattice parameter of silicon becomes 3.83 Å, and thus, the lattice mismatch with the GaN semiconductor can be drastically reduced.

Figure 1:
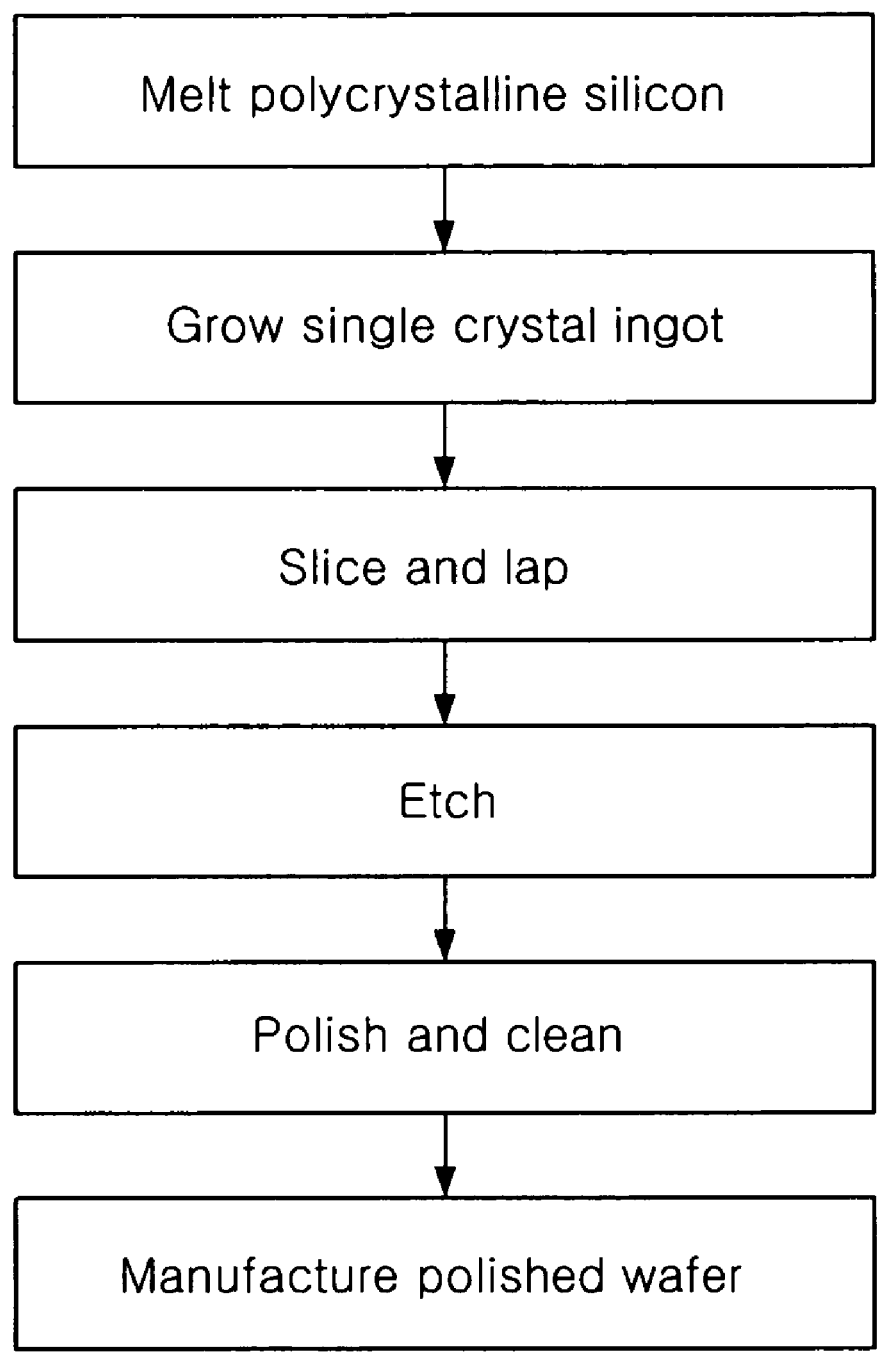
FIG. 1 is a flowchart showing a general process of manufacturing a polished wafer.

FIG. 1 is a flowchart showing a general process of manufacturing a polished wafer.

First, polycrystalline silicon (poly Si) is charged and melted in a crucible, and a seed crystal is then added. Thereafter, the seed crystal is slowly raised while being cooled such that a single crystal ingot is formed. In order to keep the silicon wafer at a constant diameter, the single crystal ingot is manufactured to have a slightly larger diameter and a portion along the edge is then removed. A diamond cup wheel is used to grind the single crystal ingot to thereby adjust the diameter to a desired value, and the ingot is then cut into blocks having a selected thickness. Thereafter, each of the blocks is cut again into a thin disk shape, which is called the slicing process. A lapping process is used to remove damage on the wafer surface caused by the slicing process, and yields a wafer having a uniform thickness and flatness. After the mechanical polishing processes, a chemical polishing process, i.e. an etching process, in which the wafer surface is treated with a chemical solution, is performed. Thereafter, a series of polishing and cleaning processes are performed such that the wafer surface has a highly precise flatness, and a polished wafer is obtained.

Figure 2:
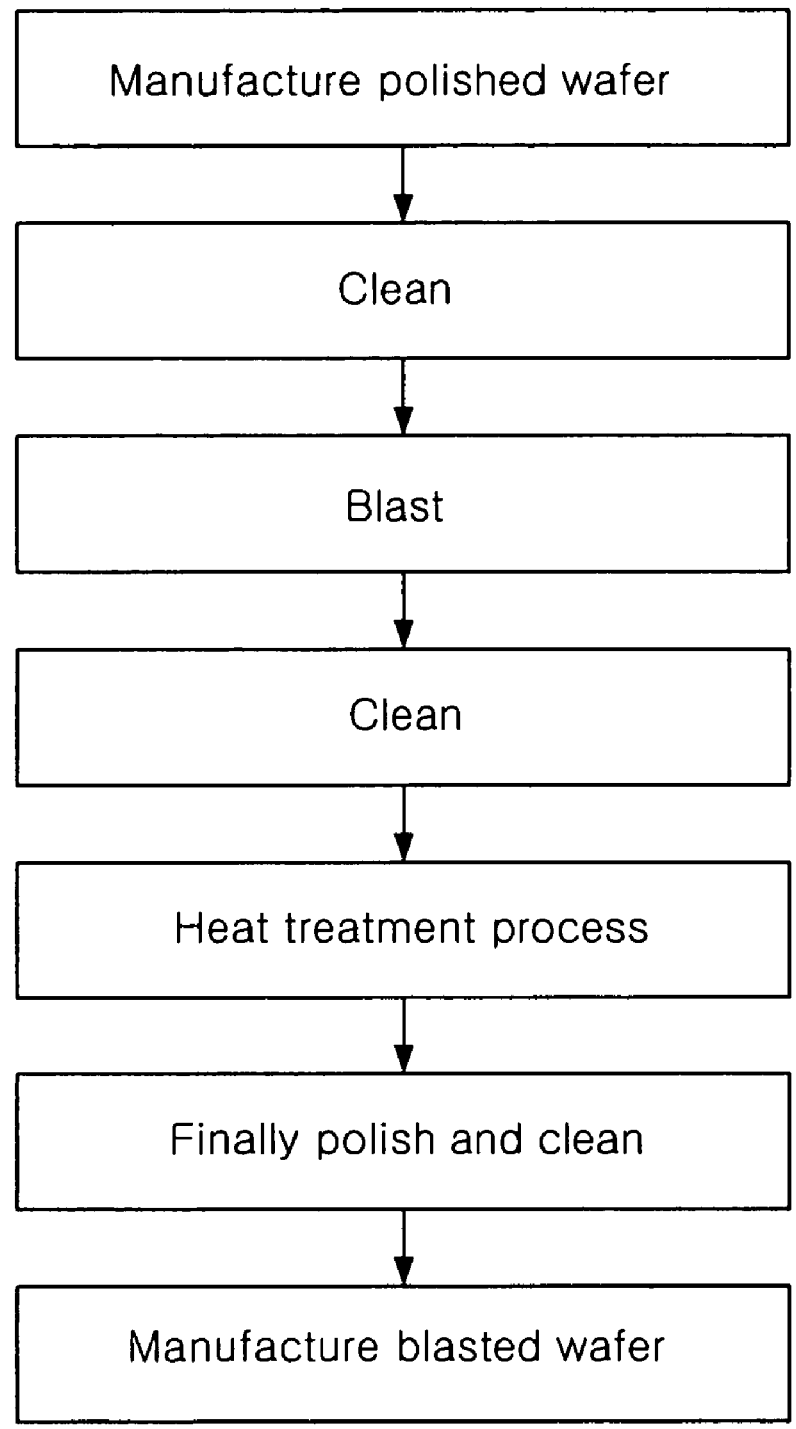
FIG. 2 is a flowchart showing a process of manufacturing a blasted wafer according to the present invention.

FIG. 2 is a flowchart showing a process of manufacturing a blasted wafer according to one aspect of the invention in which the wafer surface is further treated using a blasting process to the polished wafer manufactured as described above. According to this aspect of the invention, the polished wafer is first prepared as described above as shown in FIG. 1 (poly Si is melted to a liquid state at high temperature; a single-crystal ingot is grown; the ingot is then fabricated into the polished wafer by sequentially executing the slicing and lapping processes, the etching process, and several steps of polishing and cleaning processes).

The polished wafer is then blasted by a particle slurry blasting process. In one embodiment, the wafer is moved at a desired speed, and the top surface of the moving, polished wafer is blasted by a slurry containing $SiO_2$ particles ejected at high pressure through a nozzle. Preferably, the blasting pressure, the specific gravity of the slurry, and the particle size of the slurry are carefully controlled. The speed of the moving wafer is related to the density of defects formed on the wafer, and the blasting pressure has an influence on the depth to which a defect layer is formed in the upper portion of the wafer. In addition, the particle size of the slurry is related to an impulse applied to the wafer surface.

In one embodiment of the invention, a slurry containing $SiO_2$ particles is blasted in such a manner that a defect layer is formed in a region 1 to 4 μm below the top surface of the wafer. As the blasting pressure increases, the depth of the defect layer formed in the wafer also increases. If the defect layer is formed too deeply or too shallowly in the top surface, a stress-relieving effect cannot be expected, and the crystallinity of the GaN thin film subsequently grown on the top surface of the wafer can also be degraded. Therefore, the blasting pressure should be controlled such that the defect layer is formed to a desired depth (i.e., 1-4 μm), relative to the surface of the wafer. Further, the specific gravity of the slurry containing $SiO_2$ particles is preferably within a range of 1.020 to 1.030 g/cm³. The slurry can contain $SiO_2$ particles, deionized water (DI), processing additives, and so on.

After the blasting process has been completed, a cleaning process and a heat treatment process of stabilizing the wafer are subsequently performed. The defect layer formed in the wafer can be stably settled through the heat treatment process, which reduces stress in the nitride layer subsequently grown on the top surface of the silicon wafer. A finished blasted wafer is obtained by polishing the top surface of the stabilized wafer to a depth of less than 1 μm, and then cleaning the polished wafer.

When the GaN semiconductor thin film is grown on the blasted wafer, the defect layer formed in the upper portion of the wafer reduces lattice defects due to a difference in lattice parameters therebetween, and relieves internal stress. That is, the defect layer absorbs the stress in the silicon wafer and the nitride layer to be grown, so that the quality of the GaN semiconductor can be improved. In addition, because the wafer is made of silicon, it can be fabricated to a larger diameter (e.g., 8 inches), and the overall cost of manufacturing the GaN semiconductor costs are reduced, and productivity can be enhanced.

Table 1 shows a variety of blasting process conditions including wafer speed ("moving speed"), blasting pressure, and the number of nozzles used to eject the slurry, and the quality of the blasted wafer that results. Here, $SiO_2$ particles having a purity of 99.9% and a mean diameter of 3.4 μm are used as the particles in the blast slurry.

TABLE 1

| Grade | Blasting pressure (Kgf/cm²) | Moving speed (mm/sec) | Number of nozzles (ea) |
|---|---|---|---|
| 1 | 0.8 | 45 | 3 |
| 2 | 1.6 | 45 | 3 |
| 3 | 1.8 | 40 | 6 |
| 4 | 1.8 | 25 | 6 |

Figure 3:
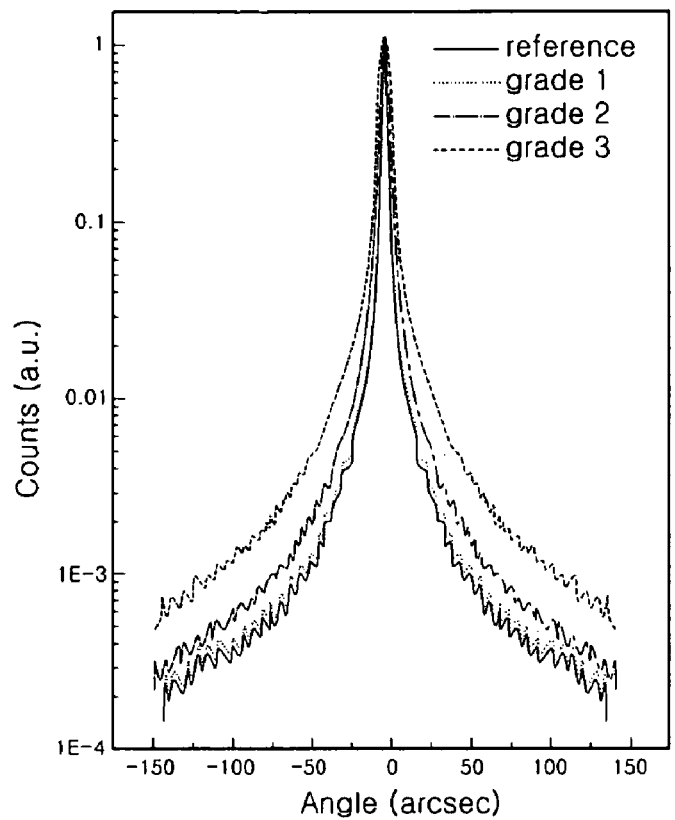
FIG. 3 is a graph illustrating crystal characteristics of the blasted wafer manufactured according to the present invention.

FIG. 3 is a graph plotting X-ray diffraction (XRD) data for observed changes in the crystallinity of the wafer according to various blasting conditions listed in Table 1. The reference in FIG. 3 shows counts of a substrate without the blasting process. Referring to this figure, each full width at half maximum (FWHM) value obtained by an X-ray diffractometer for samples manufactured according to various conditions in the blasting process is less than 10 arcsec, which shows that the silicon wafer maintains its own perfect crystal structure even after the blasting process. This indicates that there is no quality degradation in the thin film growth due to the amorphization of the wafer caused by mechanical impact during the blasting process. In addition, since the blasting effect is present in the wafer, the stress can be minimized when a thin film grows on the top surface of the wafer. That is, the crystallinity of the semiconductor thin film is excellent even though mechanical impact is applied thereto during the blasting process, and thus, lattice defects can be decreased and internal stress can also be relieved.

However, changing the blasting pressure, wafer's moving speed, or number of nozzles, as illustrated in Table 1, can degrade the crystallinity of the wafer, as shown in FIG. 3. Thus, the FWHM values are increased. Accordingly, when the mechanical impact applied to the wafer during the blasting process exceeds a certain limit, the crystallinity of the wafer is degraded, which may have an influence on the quality of the thin film that grows on the top surface of the wafer. Therefore, in order to effectively relieve internal stress and simultaneously maintain excellent crystallinity of the wafer during the blasting process, the blasting pressure, the particle size of slurry and the number of nozzles should be taken into account.

Figure 4:
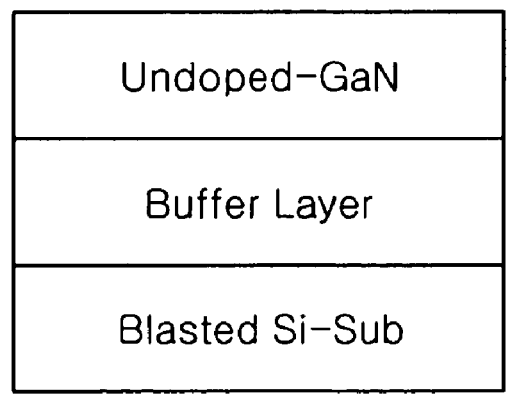
FIG. 4 is a sectional view of a gallium nitride (GaN) semiconductor fabricated according to the present invention.

FIG. 4 is a sectional view of a GaN semiconductor where the GaN single crystal thin film is grown on the blasted wafer. After treating the wafer surface using the blasting process, a buffer layer is formed on the wafer surface using metaloorganic chemical vapor deposition (MOCVD), and the GaN thin film is grown on the buffer layer. AlN, GaN, ZnO, MgO or the like may be used as a material for the buffer layer. The buffer layer is grown on the blasted wafer to a thickness of 10 to 1000 nm at a temperature of 500 to 1100° C. The buffer layer can effectively reduce crystal defects such as dislocation caused by the differences in lattice parameters and thermal expansion coefficients. On the grown buffer layer, the GaN thin film is grown at a growth rate of 1 μm per hour at an increased growth temperature of 1000 to 1200° C.

Figure 5:
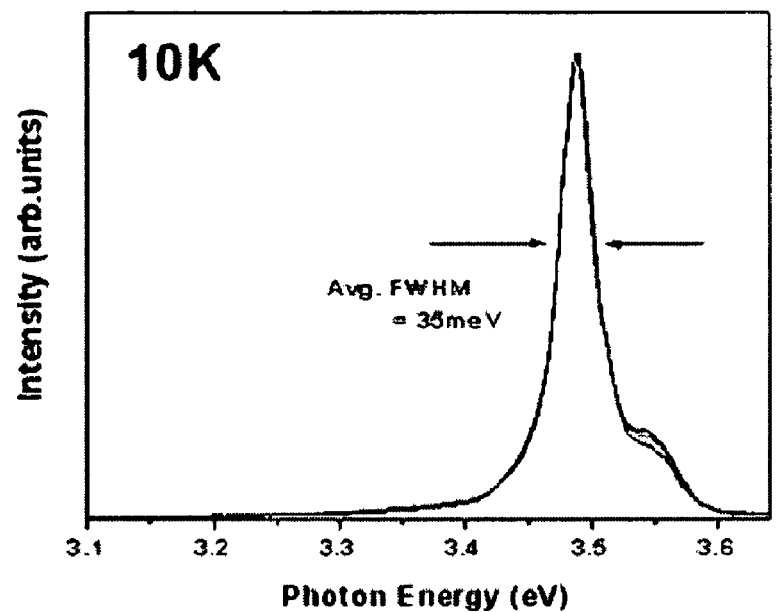
FIGS. 5 and 6 are graphs illustrating optical and crystalline properties of a GaN thin film manufactured according to the present invention.
Figure 6:
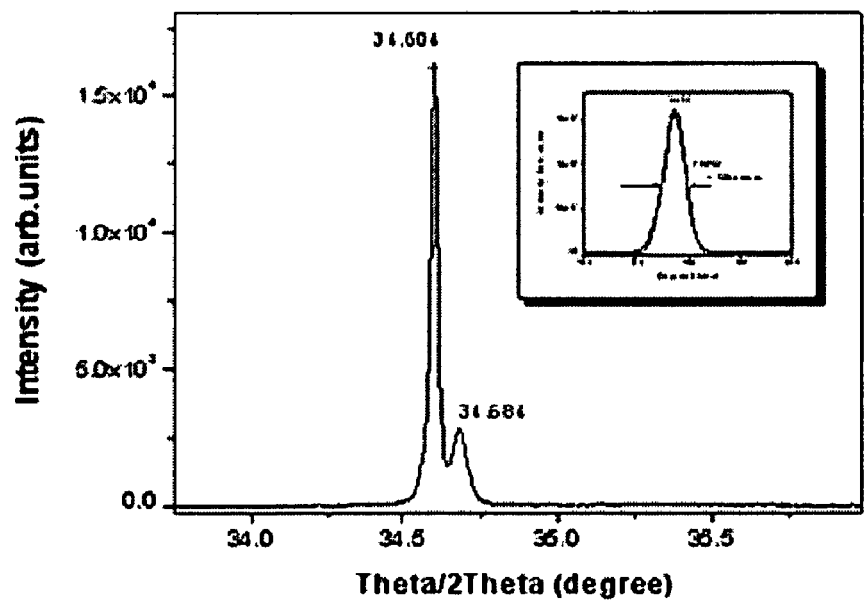

FIGS. 5 and 6 are graphs illustrating the optical and crystalline properties of a GaN thin film manufactured according to the present invention. Here, a low temperature PL was used to measure the optical property. It can be seen from the figures that the FWHM has an average value of 35 meV over the entire wafer, which exhibits good characteristics. In addition, the crystal characteristics are also enough good to exhibit superior results of about 760 arcsec.

The present invention is configured in such a manner that the GaN thin film is grown on the silicon wafer fabricated according to the aforementioned blasting process by using the metaloorganic chemical vapor deposition (MOCVD) or other growth methods. Therefore, characteristics of the GaN thin film can be reproducibly improved using a simple manufacturing process. That is, by means of the blasting process in which simple manufacturing equipment and low manufacturing costs are required, the difference in lattice parameters between the wafer and GaN thin film is minimized and the density of crystal defects within the thin film is reduced accordingly. Therefore, advantageous effects in that the crystalline and optical characteristics of the GaN thin film are improved and internal stress in the thin film is also reduced can be obtained.

According to the present invention, the crystal defects occurring when the GaN thin film is grown through the wafer blasting process can be reduced and the internal stress can also be reduced. Further, since the high-quality GaN thin film is formed on the silicon wafer, the manufacturing costs can be reduced by securing the high-quality wafer with a large diameter at a low price, and the GaN thin film can be used in a variety of devices and circuits can be improved.

What is claimed is:
1. A method of manufacturing a gallium nitride (GaN) semiconductor, comprising:
preparing a wafer having a defect layer formed in a region in the wafer comprising blasting the wafer with a high-pressure slurry containing particles;

heat-treating the wafer; and polishing and cleaning the wafer; and growing a GaN thin film on the wafer.

2. The method as claimed in claim 1, wherein the particles are made of $SiO_2$.

3. The method as claimed in claim 2, wherein the slurry has a specific gravity ranging from 1.020 to 1.030 g/cm3.

4. The method as claimed in claim 1, wherein the blasting the wafer with a high-pressure slurry causes the defect layer to form within 1 to 4 μm from a top surface of the wafer.

5. The method as claimed in claim 1, wherein a top of the wafer is polished at a depth of less than 1 μm.

6. The method as claimed in claim 1, wherein the GaN thin film is grown at a rate of 1 μm per hour and at a temperature ranging from 1000 to 1200° C.

7. The method as claimed in any one of claims 1 to 6, further comprising growing a buffer layer on the wafer before growing the GaN thin film.

8. The method as claimed in claim 7, wherein the buffer layer is grown to a thickness ranging from 10 to 1000 nm at a temperature ranging from 500 to 1100° C.

9. A method of manufacturing a gallium nitride (GaN) semiconductor comprising:

preparing a silicon wafer having a defect layer formed in a region in the wafer by the steps of (a) blasting the wafer with a high-pressure slurry containing $SiO_2$ particles, (b) heat treating the wafer, and (c) polishing and cleaning the wafer; and growing a GaN thin film on the wafer.

10. A method as claimed in claim 9, further comprising growing a buffer layer between the wafer and the GaN thin film.

* * * * *